(12) United States Patent
Ichiki et al.

(10) Patent No.: US 7,749,686 B2
(45) Date of Patent: Jul. 6, 2010

(54) METHOD FOR PRODUCING CONDUCTIVE FILM AND LIGHT-SENSITIVE MATERIAL FOR CONDUCTIVE FILM PRODUCTION

(75) Inventors: Akira Ichiki, Minami-Ashigara (JP); Joh Kumura, Minami-Ashigara (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 386 days.

(21) Appl. No.: 11/666,749

(22) PCT Filed: Sep. 29, 2006

(86) PCT No.: PCT/JP2006/320030
§ 371 (c)(1), (2), (4) Date: May 2, 2007

(87) PCT Pub. No.: WO2007/037545
PCT Pub. Date: Apr. 5, 2007

(65) Prior Publication Data
US 2007/0269675 A1 Nov. 22, 2007

(30) Foreign Application Priority Data
Sep. 30, 2005 (JP) .............................. 2005-288956

(51) Int. Cl.
*H01B 5/00* (2006.01)
*H01B 13/00* (2006.01)

(52) U.S. Cl. ................ 430/311; 430/319; 430/321; 174/256; 174/257; 174/258; 174/389; 174/392

(58) Field of Classification Search ............ None
See application file for complete search history.

(56) References Cited

U.S. PATENT DOCUMENTS

| | | |
|---|---|---|
| 2004/0229028 A1 | 11/2004 | Sasaki et al. |
| 2007/0015094 A1* | 1/2007 | Habu .................. 430/348 |
| 2009/0029125 A1* | 1/2009 | Nakahira .............. 428/209 |

FOREIGN PATENT DOCUMENTS

| | | |
|---|---|---|
| JP | 42-23746 | 11/1967 |
| JP | 08-139448 A | 5/1996 |
| JP | 10-041682 A | 2/1998 |
| JP | 10-154863 A | 6/1998 |
| JP | 10-340629 A | 12/1998 |
| JP | 2000-013088 A | 1/2000 |
| JP | 2000-59081 A | 2/2000 |
| JP | 2003-309336 A | 10/2003 |
| JP | 2004-221564 A | 8/2004 |
| JP | 2004-221565 A | 8/2004 |
| JP | 2006-024485 A | 1/2006 |
| JP | 2006-191010 A | 7/2006 |
| WO | WO 2006/088026 A1 * | 8/2006 |

* cited by examiner

*Primary Examiner*—John A. McPherson
(74) *Attorney, Agent, or Firm*—Buchanan Ingersoll & Rooney PC

(57) ABSTRACT

A method for producing a conductive film, which comprises: exposing and developing a light-sensitive material comprising a support and thereon an emulsion layer containing a silver salt emulsion to form a metallic silver; and then subjecting the light-sensitive material to a smoothing treatment (such as a calender treatment).

27 Claims, No Drawings

METHOD FOR PRODUCING CONDUCTIVE FILM AND LIGHT-SENSITIVE MATERIAL FOR CONDUCTIVE FILM PRODUCTION

TECHNICAL FIELD

The present invention relates to a method for producing a conductive film such as an electromagnetic wave-shielding film which shields electromagnetic waves generated from front faces of displays such as a CRT (cathode ray tube), a PDP (plasma display panel), a liquid crystal display, an EL (electroluminescence) display and a FED (field emission display), microwave ovens, electronic equipments, printed wiring boards and the like and has translucency, and a silver salt light-sensitive material for forming the conductive film Further, in addition to the above-mentioned applications, the invention also relates to a conductive film used for printed boards and the like, and a production method thereof

BACKGROUND ART

In recent years, electromagnetic interferences (EMI) have rapidly increased with an increase in utilization of various electric installations and electronics-applied equipments It is pointed out that EMI not only causes malfunctions and damages to electronic or electric equipments, but also damages health of operators of these apparatuses It is therefore required to suppress intensity of electromagnetic waves emitted from the electronic or electric equipments within the range of standards or regulations As a countermeasure for the above-mentioned EMI, it is necessary to shield electromagnetic waves, and for that purpose, it is self-evident that what is necessary is just to utilize the property of metals of not transmitting the electromagnetic waves For example, there are adopted a method of using a metal body or a highly conductive body as a casing, a method of inserting a metal plate between circuit boards, a method of covering a cable with a metal foil, and the like However, an operator needs to recognize characters and the like displayed on a screen of CRT or PDP, so that a display is required to have transparency Accordingly, the above-mentioned methods have been unsuitable as a method for shielding the electromagnetic waves, because all the above-mentioned methods often provide an opaque front face of the display In particular, PDP generates electromagnetic waves in a large amount compared to CRT or the like, so that stronger electromagnetic wave-shielding ability has been desired The electromagnetic wave-shielding ability can be conveniently represented by the surface resistance value For example, the surface resistance value is required to be about 300 Ω/sq or less for a light-transmitting electromagnetic wave-shielding material for CRT, whereas it is required to be 2 5 Ω/sq or less for a light-transmitting electromagnetic wave-shielding material for PDP In a household plasma television utilizing PDP, it is highly required to be 1 5 Ω/sq or less, and more desirably, an extremely high conductivity of 0 1 Ω/sq or less is required Further, as for the required level of translucency, the whole visible light transmittance is required to be about 70% or more for CRT and 80% or more for PDP, and further higher transparency has been desired In order to solve the above-mentioned problems, various materials and methods for allowing electromagnetic wave-shielding properties, conductivity and translucency to be compatible with one another by utilizing metal meshes having apertures have hitherto been proposed, as shown below (1) Silver Paste-Printed Mesh For example, there has been disclosed a method of printing a paste comprising a silver powder in network form to obtain a silver mesh (for example, see JP-A-2000-13088) The silver mesh obtained by this method has the problem that the line width is thick to decrease transmittance, because it is formed according to a printing method Further, the surface resistance value is high, resulting in low electromagnetic wave-shielding ability It is therefore necessary to apply a plating treatment to the resulting silver mesh, in order to increase electromagnetic wave-shielding ability (2) Irregular Network Silver Mesh For example, there have been disclosed an irregular minute network silver mesh and a production method thereof (for example, see JP-A-10-340629) However, this production method has the problem that only a mesh as high as 10 Ω/sq in surface resistance value (low in electromagnetic wave shielding ability) is obtained Further, there has been the problem that the haze is as high as ten-odd percents or more to cause blurring of a display image (3) Etching-Processed Copper Mesh Utilizing Photo-Lithography There has been disclosed a method for forming a copper mesh on a transparent substrate by subjecting a copper foil to etching processing using photolithography (for example, see JP-A-10-41682) This method has the advantage of being able to prepare a mesh having a high aperture ratio (high transmittance), which can shield even a strong electromagnetic wave emission, because it is possible to microfabricate the mesh However, there has been the problem that a production process thereof includes extremely many steps, through which the mesh must be produced Further, there has been the problem that the accomplished mesh shows a copper foil color, not black, because of the use of the copper foil, which causes a reduction in contrast of images in display instruments Furthermore, this mesh has the problem that the width of intersectional points in a grid pattern is thicker than that of straight-line portions, because it is produced by the etching method, and improvement of this problem has been desired in association with the problem of moire (4) Blackening of Metallic Conductive Layer As a preferable method for blackening metallic conductive layers, for example, a surface treatment method after blackening treatment (for example JP-A-2006-191010) has been proposed However, the surfaces of conductive layers as formed by plating, vapor deposition and the like are coarse as they are, disadvantageously requiring the enlargement of the thickness of the resulting blackening layers or subsequent additional surface treatment as a treatment for preventing uneven gloss (5) Conductive Silver Forming Method Utilizing Silver Salt In the 1960s, there has been disclosed a method for forming a thin film pattern of metallic silver having conductivity by a silver salt diffusion transfer process in which silver is deposited on physical development nuclei (for example, see JP-B-42-23746)

However, it does not refer to the possibility that the resulting conductive metallic silver thin film can shield electromagnetic waves emitted from image display surfaces of displays such as CRT and PDP without inhibiting the image display Actually, according to this method, a silver thin film having a surface resistance value of 10 Ω/sq to 100 KΩ/sq is obtained However, this level of conductivity is insufficient as applications for displays such as PDP Further, also in terms of high translucency, it is not sufficient Thus, translucency and conductivity can not be compatible with each other Accordingly, even when the above-mentioned silver salt diffusion transfer process is used as it is, it has been impossible to obtain a light-transmitting electromagnetic wave-shielding material which is excellent in light transmitting properties and conductivity, and suitable for shielding electromagnetic waves from image display surfaces of electronic display equipments The invention also relates to a production method of a printed board (printed wiring board), so that the background art thereof will be described bellow Conventional production methods are largely divided into two types a three-layer flexible board in which a copper foil is adhered onto an insulator film using an adhesive and a desired wiring pattern is formed by a subtractive method, and a two-layer flexible board in which a desired wiring pattern is formed by a subtractive method or an additive method, using a substrate having a ground metal layer directly provided on the insulator film without using the adhesive Further, the printed boards are classified into a flexible board and a rigid board, depending on the material used in an insulating substrate The flexible board is one in which the insulating substrate is formed of a flexible material such as a polyimide resin or a polyester resin On the other hand, the rigid board is one in which the insulating substrate is formed of a material having high hardness, such as glass or an epoxy resin Then, the three-layer flexible board whose production method is simple generally occupies the mainstream However, with a recent increase in density of electronic equipments, the wiring width in a wiring board has also come to be required to have a narrow pitch In the case of the above-mentioned three-layer flexible board, a method for forming a wiring portion by etching has been proposed (for example, JP-A-2003-309336 and the like) However, according to this method, so-called side etching in which a side face of the wiring portion is etched occurs, so that the cross-sectional shape of the wiring portion is liable to become a trapezoid widened toward the bottom Accordingly, when etching is performed until electric insulation properties between the wiring portions are secured, the wiring pitch width becomes excessively wide There has been therefore a limitation on narrowing the wiring pitch Further, the production process is complicated and complex, which causes the problem of increased production cost, and the etching process also has a problem with regard to environmental issues for waste liquid treatment Then, the larger this widening of the wiring portion to the bottom by the side etching is, the thicker the thickness of the copper foil becomes Accordingly, in order to decrease the widening to narrow the pitch, it has been necessary to use a copper foil having a thickness of 18 µm in place of the copper foil having a thickness of 35 µm which has hitherto been conventionally used However, such a thin copper foil has low rigidity, so that handling properties are poor Accordingly, there has been the problem that rigidity must be increased by laminating a reinforcing material such as an aluminum carrier Further, such lamination has also raised the problem of increased variations in film thickness or coating defects such as the occurrence of pinholes or cracks Accordingly, the thinner the thickness of the copper foil is made in order to narrow the pitch of the wiring portion, the more difficult the production of the wiring board becomes, resulting in increased production cost In particular, there have recently increased demands to a wiring board having a narrow-pitch wiring portion which can not be produced without using a copper foil having a thickness of ten-odd micron meters or less, particularly several micron meters, so that the increased production cost of the three-layer flexible board has increasingly become a problem Then, the two-layer flexible board in which a copper coating can be directly formed on the insulator film without applying the adhesive has come to be noted In the two-layer flexible board, the ground metal layer is directly formed on the insulator film by dry plating or wet plating without using the adhesive, and the copper conductive layer is formed thereon by an electroplating method It has therefore the advantages that the thickness of the substrate itself can be decreased, and moreover, that the thickness of the copper conductive coating to be adhered can also be adjusted to any thickness A forming method of the ground metal generally employed at present in order to obtain the two-layer flexible board of this kind is a dry plating method There has been proposed a method of adhering the ground metal layer onto the insulator film, and then, further forming the copper coating thereon by dry plating (for example, JP-A-8-139448 and JP-A-10-154863) However, usually, many pinholes having a size of tens to hundreds of micron meters are present in the coating obtained by the dry plating method The final thickness of the copper coating formed is from about 0 2 to about 0 5 µm, and exposed parts caused by pinholes frequently occur in the two-layer flexible board In order to prevent this, it is necessary to repeat ground formation or to impart a catalyst Accordingly, a problem has arisen in terms of production cost

DISCLOSURE OF THE INVENTION

As described above, the conventional electromagnetic wave-shielding materials and methods for producing them each have the problems Above all, an electromagnetic wave-shielding plate obtained by forming a mesh composed of a metal thin film on a transparent glass or plastic substrate surface has extremely high electromagnetic wave-shielding properties, and good light transmitting properties are obtained, so that it has recently come to be used as an electromagnetic wave-shielding material for a display panel such as PDP However, reduction of the production cost has been strongly desired because of its extremely high price Further, high lightness of images is required for a display, so that it has required that the light transmittance is close to 100%, and that the color of the mesh is black However, when the proportion of the open area ratio (portions not having fine lines constituting a mesh) with respect to the total is increased in order to improve light transmitting properties, conductivity is decreased to degrade electromagnetic wave-shielding effect It has therefore been extremely difficult to simultaneously improve conductivity (electromagnetic wave-shielding effect) and light transmitting properties by conventional techniques The invention has been made in view of such a situation An object of the invention is to provide a conductive film in which a metal portion has high conductivity and a nonmetal portion has excellent translucency and/or insulating properties More specifically, an object of the invention is to provide a light-transmitting electromagnetic wave-shielding film simultaneously having high electromagnetic wave-shielding properties and high translucency, and having a black mesh portion, and to provide a method for producing a light-transmitting electromagnetic wave-shielding film, in which the formation of a fine line pattern is possible in a short process, and which can be produced at low cost in large amounts Another object of the invention is to provide a light-transmitting electromagnetic wave-shielding film for a plasma display panel utilizing the light-transmitting electromagnetic wave-shielding film obtained by the above-mentioned production method and a plasma display panel using the same Further, as described above, in the conventional printed boards and production methods thereof, there have been the problems with regard to side etching, pinholes, cost and the like The wiring width is required to have a narrow pitch from the demand for a recent increase in density of wiring From this, a copper foil or copper film is required to be thinned However, when it is thinned, pinhole characteristics are deteriorated As described above, the compatibility of an increase in density of wiring and pinhole characteristics is in a difficult state Further, when the through hole plating time is taken long intending to secure conductivity in a double-sided printed board, the conductor thickness increases to degrade flexibility, resulting in the difficulty of the compatibility of conductivity and flexibility Furthermore, a method for forming a conductive metallic silver pattern using a conventional silver salt light-sensitive material has been insufficient for utilization as a printed board material in terms of conductivity and insulating properties between conducting wires The invention has been made in view of such a situation, and therefore, still another specific object of the invention is to provide a method for producing a printed board material simultaneously having high conductivity and high insulating properties, and having no pinholes, with easy formation of a fine line pattern and small environmental loading at low cost in large amounts, and further to provide a silver salt light-sensitive material which becomes extremely advantageous for the production thereof Yet still another object of the invention is to provide a printed wiring board obtained by the above-mentioned production method The present inventors have made intensive studies of simultaneously obtaining high conductivity, electromagnetic wave-shielding properties and high translucency, and simultaneously obtaining high conductivity and high insulating properties, for conductive electromagnetic wave-shielding films As a result, it has been found that a significant increase in conductivity is obtained by performing a smoothing treatment in a production process, and it has been revealed that the above-mentioned two kinds of problems of the conductive film to be solved can be achieved by utilizing this phenomenon That is to say, the invention has been accomplished by the following methods for producing a conductive film (1) A method for producing a conductive film, which comprises exposing and developing a light-sensitive material comprising a support and thereon an emulsion layer containing a silver salt emulsion to form a metallic silver portion, and then subjecting the light-sensitive material to a smoothing treatment (2) The method as described in (1) above, which comprises exposing and developing a light-sensitive material comprising a support and thereon an emulsion layer containing a silver salt emulsion to form a metallic silver portion and a light-transmitting portion, and then subjecting the light-sensitive material to a smoothing treatment (3) The method as described in (1) above, which comprises exposing and developing a light-sensitive material comprising a support and thereon an emulsion layer containing a silver salt emulsion to form a metallic silver portion and an insulating portion, and then subjecting the light-sensitive material to a smoothing treatment (4) The method as described in any one of (1) to (3) above, wherein the metallic silver portion after the smoothing treatment comprises a silver and a non-conductive polymer, and wherein a volume ratio of Ag/the non-conductive polymer is 2/1 or more (5) The method as described in any one of (1) to (4) above, wherein the metallic silver portion after the smoothing treatment comprises a silver and a non-conductive polymer, and wherein a volume ratio of Ag/the non-conductive polymer is 3/1 or more (6) The method as described in any one of (1) to (5) above, wherein 50% or more of a volume of the non-conductive polymer is occupied by gelatin (7) The method as described in any one of (1) to (6) above, which further comprises dipping the light-sensitive material in an aqueous solution of a reducing agent between after the developing treatment and to the smoothing treatment (8) The method as described in any one of (1) to (7) above, which further comprises subjecting a surface of the metallic silver portion to a blackening treatment after the smoothing treatment (9) The method as described in (8) above, wherein a solution for the blackening treatment contains at least one of nickel, zinc and tin

(10) The method as described in any one of (1) to (9) above, wherein the smoothing treatment is performed with a calender roll unit

(11) The method as described in (10) above, wherein the smoothing treatment with the calender roll unit is performed at a line pressure of 980 N/cm (100 kgf/cm) or more

(12) The method as described in (10) or (11) above, wherein the smoothing treatment with the calender roll unit is performed at a line pressure of 1960 N/cm (200 kgf/cm) or more

(13) The method as described in any one of (10) to (12) above, wherein the smoothing treatment with the calender roll unit is performed at a line pressure of 2940 N/cm (300 kgf/cm) or more

(14) The method as described in any one of (1) to (13) above, wherein a volume ratio of Ag/a binder in the emulsion layer is 1/2 or more

(15) The method as described in any one of (1) to (14) above, wherein a volume ratio of Ag/a binder in the emulsion layer is 1/1 or more

(16) The method as described in any one of (1) to (15) above, wherein a volume ratio of Ag/a binder in the emulsion layer is 2/1 or more

(17) The method as described in any one of (1) to (16) above, wherein the silver salt emulsion contained in the emulsion layer is a silver halide

(18) The method as described in (17) above, wherein the silver halide is mainly composed of a silver chloride

(19) The method as described in (17) or (18) above, wherein the silver halide comprises at least one of a rhodium compound and an iridium compound

(20) The method as described in any one of (1) to (19) above,
wherein the emulsion layer is provided on both sides of the support

(21) The method as described in any one of (1) to (20) above,
wherein the support has flexibility

(22) The method as described in any one of (1) to (21) above,
wherein the support is a polyethylene terephthalate (PET) film

(23) The method as described in any one of (1) to (21) above,
wherein the support is a polyimide film

(24) The method as described in any one of (1) to (23) above,
wherein the emulsion layer is disposed substantially as an uppermost layer, and contains at least one of a matting agent, a lubricant, a colloidal silica and an antistatic agent

(25) A method for producing a conductive film, comprising any combination of (1) to (24) above

(26) The method as described in any one of (1) to (25) above,
wherein the exposure is performed by a scanning exposure system with a laser beam

(27) The method as described in any one of (1) to (25) above,
wherein the exposure is performed through a photomask

(28) The method as described in any one of (1) to (27) above,
wherein a developing solution used in the development of the emulsion layer contains an image quality improver

(29) The method as described in any one of (1) to (28) above,
wherein a developing solution used in the development of the emulsion layer is a lithographic developing solution

(30) The method as described in any one of (1) to (29) above,
wherein a content of the metallic silver contained in an exposed area after the development is 50% or more by mass based on a mass of a silver contained in the exposed area before the exposure

(31) The method as described in any one of (1) to (30) above,
wherein a gradation after the development of the emulsion layer exceeds 4 0

(32) The method as described in any one of (2) and (4) to (31) above,
wherein the light-transmitting portion does not substantially have physical development nuclei

(33) A conductive film obtained by a production method as described in any one of (1) to (32) above

(34) The conductive film as described in (33) above, which is an electromagnetic wave-shielding film

(35) The conductive film as described in (33) above, which is a printed wiring board

(36) The conductive film as described in any one of (33) to (35) above, which comprises
a support and thereon
a metal wiring pattern containing a silver at a density of 8 0 g/cm$^3$ to 10 5 g/cm$^3$

(37) The conductive film as described in (36) above,
wherein a thickness of the metal wiring pattern is from 0 5 μm to 5 μm Further, the object of the invention is achieved by a light-transmitting electromagnetic wave-shielding film comprising the following embodiments

(38) A light-transmitting electromagnetic wave-shielding film having a conductive metal portion and a light-transmitting portion, which is obtained by a method as described in any one of (1) to (32) above

(39) The light-transmitting electromagnetic wave-shielding film as described in (38) above,
wherein a shape of the conductive metal portion is a mesh form

(40) The light-transmitting electromagnetic wave-shielding film as described in (38) or (39) above, wherein an open area ratio of the conductive metal portion is 85% or more

(41) The light-transmitting electromagnetic wave-shielding film as described in any one of (38) to (40) above,
wherein a line width of the conductive metal portion is from 0 1 μm to less than 18 μm

(42) The light-transmitting electromagnetic wave-shielding film as described in any one of (38) to (41) above,
wherein a line width of the conductive metal portion is from 0 1 μm to less than 14 μm

(43) The light-transmitting electromagnetic wave-shielding film as described in any one of (38) to (42) above,
wherein a line width of the conductive metal portion is from 0 1 μm to less than 10 μm

(44) The light-transmitting electromagnetic wave-shielding film as described in any one of (38) to (43) above,
wherein a line width of the conductive metal portion is from 0 1 μm to less than 7 μm Furthermore, the object of the invention is achieved by a printed board comprising the following embodiments

(45) A printed board having a conductive metal portion and an insulating portion, which is obtained by a production method as described in any one of (1) to (32) above

(46) The printed board as described in (45) above,
wherein a line width of the conductive metal portion is from 0 1 μm to less than 18 μm

(47) The printed board as described in (45) or (46) above,
wherein a line width of the conductive metal portion is from 0 1 μm to less than 14 μm

(48) The printed board as described in any one of (45) to (47) above,
wherein a line width of the conductive metal portion is from 0 1 μm to less than 10 μm

(49) The printed board as described in any one of (45) to (48) above,
wherein a line width of the conductive metal portion is from 0 1 μm to less than 7 μm

(50) A conductive film, which comprises
a support and thereon
a metal wiring pattern,
wherein the metal wiring pattern is subjected to a smoothing treatment

(51) The conductive film as described in (50) above,
wherein the metal wiring pattern contains a silver at a density of 8 0 g/cm$^3$ to 10 5 g/cm$^3$

(52) The conductive film as described in (50) or (51) above,
wherein a thickness of the metal wiring pattern is from 0 5 μm to 5 μm

(53) The conductive film as described in any one of (50) to (52) above,
wherein a line width of the metal wiring pattern is from 0 1 μm to less than 18 μm

BEST MODE FOR CARRYING OUT THE INVENTION

The methods for producing conductive films according to the invention, particularly the method for producing a light-transmitting electromagnetic wave-shielding film and the method for producing a printed board, will be described in detail below In the present specification, "to" indicating the range is used as including numerical values described before and after it as a lower limit value and an upper limit value, respectively (Light-Sensitive Materials for Conductive Film Production)

[Support]

As the support of the light-sensitive material used in the production method of the invention, there can be used a plastic film, a plastic plate, a glass plate or the like As raw materials for the above-mentioned plastic film and plastic plate, there can be used polyesters such as polyethylene terephthalate (PET) and polyethylene naphthalate, polyolefins such as polyethylene (PE), polypropylene (PP), polystyrene and EVA, vinyl resins such as polyvinyl chloride and polyvinylidene chloride, polyether ether ketones (PEEK), polysulfones (PSF), polyether sulfones (PES), polycarbonates (PC), polyamides, polyimides, acrylic resins, triacetyl cellulose (TAC) and the like The plastic film and plastic plate in the invention can be used as a monolayer, or can also be used as a multilayer film in which two or more layers are combined Further, a metal foil support such as aluminum can also be used

[Silver Salt-Containing Layer]

The light-sensitive material used in the production method of the invention has an emulsion layer containing a silver salt emulsion (silver salt-containing layer) on the support as an optical sensor The silver salt-containing layer can contain a binder, a solvent and the like, in addition to the silver salt Further, when there is no doubt, the emulsion layer containing a silver salt emulsion (or the silver salt-containing layer) is simply called "the emulsion layer" in some cases Furthermore, the emulsion layer is preferably disposed substantially as an uppermost layer "The emulsion layer is disposed substantially as an uppermost layer" as used herein means not only the case where the emulsion layer is actually disposed as an upper layer, but also the case where the total film thickness of a layer provided on the emulsion layer is 0 5 µm or less The total film thickness of the layer provided on the emulsion layer is preferably 0 2 µm or less The emulsion layer can contain a dye, a binder, a solvent and the like as needed The respective components contained in the emulsion layer will be explained below <Dye>

In the light-sensitive material, at least the dye may be contained in the emulsion layer The dye is contained in the emulsion layer as a filter dye or for various purposes such as prevention of irradiation As the above-mentioned dye, a solid disperse dye may be contained The dyes preferably used in the invention include dyes represented by general formula (FA), general formula (FA1), general formula (FA2) and general formula (FA3) described in JP-A-9-179243, and specifically, compounds F1 to F34 described in ibid are preferred Further, (II-2) to (II-24) described in JP-A-7-152112, (III-5) to (III-18) described in JP-A-7-152112, (IV-2) to (IV-7) described in JP-A-7-152112, and the like are also preferably used In addition, the dyes which can be used in the invention include a cyanine dye, a pyrylium dye and an aluminum dye which are described in JP-A-3-138640, as fine solid particle dispersion type dyes decolorized at the time of development or fixing Further, dyes not decolorized at the time of the treatment include a carboxyl group-containing cyanine dye described in JP-A-9-96891, a cyanine dye containing no acidic group described in JP-A-8-245902, a lake type cyanine dye described in JP-A-8-333519, a cyanine dye described in JP-A-1-266536, a holopolar type cyanine dye described in JP-A-3-136038, a pyrylium dye described in JP-A-62-299959, a polymer type cyanine dye described in JP-A-7-253639, a fine solid particle dispersion of a an oxonol dye described in JP-A-2-282244, light-scattering particles described in JP-A-63-131135, a Yb3+ compound described in JP-A-9-5913, an ITO powder described in JP-A-7-113072, and the like Further, dyes represented by general formula (F1) and general formula (F2) described in JP-A-9-179243, specifically compounds F35 to F112 described in ibid, can also be used The above-mentioned dyes include water-soluble dyes Such water-soluble dyes include an oxonol dye, a benzylidene dye, a merocyanine dye, a cyanine dye and an azo dye Above all, an oxonol dye, a hemioxonol dye and a benzylidene dye are useful in the invention Specific examples of the water-soluble dyes that can be used in the invention include ones described in British Patents 584,609 and 1,177,429, JP-A-48-85130, JP-A-49-99620, JP-A-49-114420, JP-A-52-20822, JP-A-59-154439, JP-A-59-208548, U.S. Pat. Nos. 2,274,782, 2,533,472, 2,956,879, 3,148,187, 3,177,078, 3,247,127, 3,540,887, 3,575,704, 3,653,905 and 3,718,427

The content of the dye in the above-mentioned emulsion layer is preferably from 0 01 to 10% by mass, and more preferably from 0 1 to 5% by mass, based on the total solid content, from the viewpoints of the effect of irradiation prevention and a decrease in sensitivity due to an increase in the amount added (In this specification, mass ratio is equal to weight ratio <Silver Salt>

Examples of the silver salt used in the invention include inorganic silver salts such as silver halides and organic silver salts such as silver acetate In the invention, silver halides that are excellent in characteristics as an optical sensor are preferably used The silver halides preferably used in the invention will be explained In the invention, the silver halides which are excellent in characteristics as an optical sensor are preferably used, and techniques used in silver salt photographic films relating to silver halides, photographic paper, films for printing plate making, emulsion masks for photomasks and the like can also be used in the invention A halogen element contained in the above-mentioned silver halide may be any of chlorine, bromine, iodine and fluorine, or they may be combined For example, a silver halide mainly comprising AgCl, AgBr or AgI is preferably used, and further, a silver halide mainly comprising AgBr or AgCl is more preferably used Silver chlorobromide, silver iodochlorobromide silver iodobromide are also preferably used More preferred are silver chlorobromide, silver bromide and silver iodobromide, and silver chlorobromide and silver iodochlorobromide that contain 50 mol % or more of silver chloride are most preferably used The term "a silver halide mainly comprising AgBr (silver bromide)" as used herein means a silver halide in which the molar fraction of bromide ions occupying in a silver halide composition is 50% or more Such silver halide grains mainly comprising AgBr may contain iodide ions and chloride ions, in addition to the bromide ions The silver iodide content in the silver halide emulsion is preferably 1 5 mol % per mol of silver halide emulsion Adjustment of the silver iodide content to 1 5 mol % can prevent fogging and improve pressure properties The silver iodide content is more preferably 1 mol % or less per mol of silver halide emulsion The silver halide is in solid grain form From the viewpoint of image quality of a patterned metallic silver layer formed after exposure and development, the average grain size of the silver halide is preferably from 0 1 to 1000 nm (1 µm), more preferably from 0 1 to 100 nm, and still more preferably from 1 to 50 nm, in terms of the sphere-corresponding diameter The sphere-corresponding diameter of silver halide grains means the diameter of a grain having a spherical grain shape and the same volume The shape of the silver halide grain is not particularly limited, and the grain can be of various shapes, for example, spherical, cubic, tabular (hexagonal tabular, triangular tabular, square tabular and the like), octahedral, tetradecahedral shapes and the like The inside and a surface layer of the silver halide grain may be composed of either a homogeneous phase or different phases, respectively Further, the inside or the surface of the grain may have a localized layer different in halogen composition The silver halide emulsion which is a coating solution for the emulsion layer used in the invention can be prepared by methods described in P Glafkides, Chimie et Physique Photographique (published by Paul Montel, 1967), G F Dufin, Photographic Emulsion Chemistry (published by The Forcal Press, 1966), V L Zelikman et al, Making and Coating Photographic Emulsion (published by The Forcal Press, 1964) and the like That is to say, a method for preparing the above-mentioned silver halide emulsion may be any of an acidic method, a neutral method and the like As a method for reacting a soluble silver salt with a soluble halogen salt, there may be used any of a single jet method, a double jet method, a combination thereof and the like Further, as a method for forming silver grains, there can also be used a method of forming the grains in the presence of excess silver ions (so-called reverse mixing method) Furthermore, as one type of the double jet method, there can also be used a method of keeping constant the pAg in a liquid phase in which the silver halide is formed, that is to say, a so-called controlled double-jet method In addition, it is also preferred that the formation of the silver halide grains is performed using a so-called silver halide solvent such as ammonia, a thioether or a tetrasubstituted thiourea In such a method, more preferred is a tetrasubstituted thiourea, which is described in JP-A-53-82408 and JP-A-55-77737 Preferred examples of the thiourea compounds include tetramethylthiourea and 1,3-dimethyl-2-imidazolidinethione Although the amount of the silver halide solvent added varies depending on the kind of compound used, the desired grain size and the halogen composition, it is preferably form $10^{-5}$ to $10^{-2}$ mol per mol of silver halide According to the grain formation method using the above-mentioned controlled double jet method and silver halide solvent, a silver halide emulsion having a regular crystal form and a narrow grain size distribution is easily produced This method can be therefore preferably used in the invention In order to make the grain size uniform, it is preferred that silver is allowed to glow rapidly within the range not exceeding the critical degree of saturation, using a method of changing the rate of addition of silver nitrate or an alkali halide depending on the grain growth rate, as described in British Patent 1,535,016, JP-B-48-36890 and JP-B-52-16364, or a method of changing the concentration of the aqueous solution, as described in British Patent 4,242,445 and JP-A-55-158124 The silver halide emulsion used in the formation of the emulsion layer in the invention is preferably a monodisperse emulsion, and the coefficient of variation represented by (standard deviation of grain size/average grain size)×100 is preferably 20% or less, more preferably 15% or less, and most preferably 10% or less The silver halide emulsion used in the invention may be a mixture of plural kinds of silver halide emulsions different in grain size The silver halide emulsion used in the invention may contain a metal belonging to group VIII or group VIIB In particular, in order to achieve high contrast and low fogging, it is preferred to contain a rhodium compound, an iridium compound, a ruthenium compound, an iron compound, an osmium compound or the like These compounds may be compounds having various kinds of ligands The ligands include, for example, cyanide ions, halogen ions, thiocyanate ions, nitrosyl ions, water, hydroxide ions and the like, and in addition to such pseudohalogens and ammonia, organic molecules such as amines (methylamine, ethylenediamine and the like), heterocyclic compounds (imidazole, thiazole, 5-methylthiazole, mercaptoimidazole and the like), urea and thiourea Further, for high sensitization, doping of a hexa-cyanated metal complex such as $K_4[Fe(CN)_6]$, $K_4[Ru(CN)_6]$ or $K_3[Cr(CN)_6]$ is advantageously performed As the above-mentioned rhodium compound, a water-soluble rhodium compound can be used The water-soluble rhodium compounds include, for example, a rhodium (III) halide compound, a hexachlororhodium (III) complex salt, a pentachloroaquorhodium (III) complex salt, a tetrachlorodiaquorhodium (III) complex salt, a hexabromorhodium (III) complex salt, a hexaamminerhodium (III) complex salt, a trioxalatorhodium (III) complex salt, $K_3Rh_2Br_9$ and the like These rhodium compounds are dissolved in water or a suitable solvent to be used There can be used a method commonly employed for stabilizing a solution of a rhodium compound, that is to say, a method of adding an aqueous solution of a hydrogen halide (for example, hydrochloric acid, hydrobromic acid or hydrofluoric acid) or an alkali halide (for example, KCl, NaCl, KBr or NaBr) Instead of using the water-soluble rhodium, it is also possible to add and dissolve other silver halide grains previously doped with rhodium, in the preparation of silver halide The above-mentioned iridium compounds used in the invention include a hexachloroiridium complex salt such as $K_2IrCl_6$ or $K_3IrCl_6$, a hexabromoiridium complex salt, a hexaammineiridium complex salt, a pentachloronitrosyliridium complex salt and the like The above-mentioned ruthenium compounds include hexachlororuthenium, pentachloronitrosylruthenium, $K_4[Ru(CN)_6]$ and the like The above-mentioned iron compounds include potassium hexacyanoferrate (III) and ferrous thiocyanate Ruthenium and osmium described above are added in the form of water-soluble complex salts described in JP-A-63-2042, JP-A-1-285941, JP-A-2-20852, JP-A-2-20855 and the like, and particularly preferred examples thereof include a hexa-coordinated complex represented by the following formula $$[ML_6]^{-n}$$

wherein M represents Ru or Os, and n represents 0, 1, 2, 3 or 4

In this case, a counter ion has no importance, and, for example, an ammonium or alkali metal ion is used Preferred examples of the ligands include a halide ligand, a cyanide ligand, a cyanate ligand, a nitrosyl ligand, a thionitrosyl ligand and the like Specific examples of the complexes used in the invention are shown below, but the invention should not be construed as being limited thereto $[RuCl_6]^{-3}$, $[RuCl_4(H_2O)_2]^{-1}$, $[RuCl_5(NO)]^{-2}$, $[RuBr_5(NS)]^{-2}$, $[Ru(CO)_3Cl_3]^{-2}$, $[Ru(CO)Cl_5]^{-2}$, $[Ru(CO)Br_5]^{-2}$, $[OsCl_6]^{-3}$, $[OsCl_5(NO)]^{-2}$, $(Os(NO)(CN)_5]^{-2}$, $[Os(NS)Br_5]^{-2}$ and $[Os(O)_2(CN)_4]^{-4}$ The amount of these compounds added is preferably from $10^{-10}$ to $10^{-2}$ mol/mol Ag, and more preferably from $10^{-9}$ to $10^{-3}$ mol/mol Ag, per mol of silver halide In addition, a silver halide containing a Pd(II) ion and/or Pd metal can also be preferably used in the invention Pd may be uniformly distributed in a silver halide grain However, it is preferably contained in the vicinity of a surface layer of the silver halide grain The expression "Pd is contained in the vicinity of a surface layer of the silver halide grain" as used herein means that the grain has a layer having a higher content of palladium within a thickness of 50 nm from the surface of the silver halide grain in the depth direction than the other layers Such silver halide grains can be formed by adding Pd in the course of the formation of the silver halide grains It is preferred that Pd is added after silver ions and halogen ions have each been added in an amount of 50% or more of the total amount added Further, it is also preferred that Pd(II) ions are allowed to exist in the silver halide surface layer by a method of adding the ions at the time of post-ripening, or the like These Pd-containing silver halide grains enhance the speeds of physical development and electroless plating to increase the production efficiency of a desired electromagnetic wave-shielding material, thereby contributing to a reduction in production cost Pd is well known and used as an electroless plating catalyst In the invention, however, Pd can be localized in the surface layer of the silver halide grain, so that extremely expensive Pd can be saved In the invention, the content of Pd ions and/or Pd metal contained in the silver halide is preferably from $10^{-4}$ to 0 5 mol/mol Ag, and more preferably from 0 01 to 0 3 mol/mol Ag, based on the molar number of silver in the silver halide Examples of the Pd compounds used include $PdCl_4$, $Na_2PdCl_4$ and the like In the invention, chemical sensitization may be performed or not, similarly to the case of general silver halide photographic light-sensitive materials. The chemical sensitization is performed, for example, by adding to a silver halide emulsion a chemical sensitizer comprising a chalcogenite compound or a noble metal compound which has the function of enhancing the sensitivity of a photographic light-sensitive material, which is described in JP-A-2000-275770, paragraph number 0078 and later. As the silver salt emulsion used in the light-sensitive material of the invention, there can be preferably used an emulsion not subjected to such chemical sensitization, that is to say, a chemically unsensitized emulsion. As a preferred method for preparing the chemically unsensitized emulsion in the invention, it is preferred that the amount of the chemical sensitizer comprising a chalcogenite compound or a noble metal compound added is limited to an amount equal to or less than such an amount that an increase in sensitivity caused by the addition thereof is within 0.1. There is no limitation on the specific amount of the chalcogenite or noble metal compound added. However, as the preferred method for preparing the chemically unsensitized emulsion in the invention, it is preferred that the total amount of these chemical sensitizing compounds is adjusted to $5 \times 10^{-7}$ mol or less per mol of silver halide.

In the invention, in order to further improve sensitivity as an optical sensor, chemical sensitization that is carried out for photographic emulsions can also be performed As methods for the chemical sensitization, there can be used, for example, chalcogen sensitization such as sulfur sensitization, selenium sensitization and tellurium sensitization, noble metal sensitization such as gold sensitization, reduction sensitization and the like These are used alone or in combination When the above-mentioned methods for the chemical sensitization are used in combination, for example, combinations of sulfur sensitization and gold sensitization, sulfur sensitization, selenium sensitization and gold sensitization, sulfur sensitization, tellurium sensitization and gold sensitization, and the like are preferred The above-mentioned sulfur sensitization is usually performed by adding a sulfur sensitizer and stirring the emulsion at a temperature as high as 40° C. or higher for a predetermined time As the above-mentioned sulfur sensitizer, a well-known compound can be used For example, in addition to sulfur compounds contained in gelatin, various sulfur compounds such as thiosulfates, thioureas, thiazoles and rhodanines can be used Preferred examples of the sulfur compounds are thiosulfates and thiourea compounds The amount of the sulfur sensitizer added varies depending on various conditions such as the pH, the temperature and the grain size of silver halide at the time of chemical ripening, and it is preferably from $10^{-7}$ to $10^{-2}$ mole per mole of silver halide, and more preferably from $10^{-5}$ to $10^{-3}$ mole As a selenium sensitizer used in the above-mentioned selenium sensitization, a well-known selenium compound can be used That is to say, the above-mentioned selenium sensitization is usually performed by adding an unstable type selenium compound and/or a non-unstable type selenium compound and stirring the emulsion at a high temperature of 40° C. or higher for a predetermined time As the above-mentioned unstable type compounds, there can be used compounds described in JP-B-44-15748, JP-B-43-13489, JP-A-4-109240, JP-A-4-324855 and the like In particular, compounds represented by general formulas (VIII) and (IX) in JP-A-4-324855 are preferably used A tellurium sensitizer used in the above-mentioned tellurium sensitization is a compound that forms silver telluride presumed to become a sensitization nucleus in a surface or an interior of a silver halide grain The formation rate of silver telluride in the silver halide emulsion can be examined according to a method disclosed in JP-A-5-313284 Specifically, there can be used compounds described in U.S. Pat. Nos. 1,623,499, 3,320,069, 3,772,031, British Patents 235, 211, 1,121,496, 1,295,462, 1,396,696, Canadian Patent 800, 958, JP-A-4-204640, JP-A-4-271341, JP-A-4-333043, JP-A-5-303157, *J Chem Soc Chem Commun*, 635 (1980), ibid, 1102 (1979), ibid, 645 (1979), *J Chem Soc Perkin Trans*, 1, 2191 (1980), edited by S Patai, *The Chemistry of Organic Selenium and Tellurium Compounds*, Vol 1 (1986), and ibid, Vol 2 (1987) In particular, compounds represented by general formulas (II), (III) and (IV) in JP-A-5-313284 are preferred The amounts of the selenium sensitizer and the tellurium sensitizer which can be used in the invention vary depending on the silver halide grains used and the conditions of chemical ripening, but are generally from about $10^{-8}$ to $10^{-2}$ mol, and preferably from about $10^{-7}$ to $10^{-3}$ mol, per mol of silver halide There is no particular limitation on the conditions of chemical sensitization in the invention, However, the pH is from 5 to 8, the pAg is from 6 to 11, and preferably from 7 to 10, and the temperature is from 40 to 95° C., and preferably from 45 to 85° C.

Further, noble metal sensitizers include gold, platinum, palladium, iridium and the like, and gold sensitization is particularly preferred The gold sensitizers used in the gold sensitization include chloroauric acid, potassium chloroaurate, potassium aurithiocyanate, gold sulfide, thioglucose gold (I), thiomannose gold (I) and the like, which can be used in an amount of about $10^{-7}$ to $10^{-2}$ mol per mol of silver halide In the silver halide emulsion used in the invention, a cadmium salt, a sulfite, a lead salt, a thallium salt or the like may be allowed to coexist in the course of the formation of the silver halide grains or physical ripening Further, in the invention, reduction sensitization can be used As reduction sensitizers, there can be used stannous salts, amines, formamidinesulfinic acids, silane compounds and the like A thiosulfonic acid compound may be added to the above-mentioned silver halide emulsion according to a method shown in European Laid-Open Patent (EP) 293917 The silver halide emulsions used in the preparation of the light-sensitive material used in the invention may be used either alone or as a combination of two or more thereof (for example, different in average grain size, different in halogen composition, different in crystal habit, different in chemical sensitization conditions or differing in sensitivity) Above all, in order to obtain high contrast, it is preferred to apply an emulsion having a higher sensitivity to closer to a support, as disclosed in JP-A-6-324426

In the emulsion layer, a binder can be used in order to uniformly disperse the silver salt grains and assist adhesion of the emulsion layer and the support In the invention, although either a water-insoluble polymer or a water-soluble polymer can be used as the binder, a water-soluble polymer is preferably used The above-mentioned binders include, for example, gelatin, polyvinyl alcohol (PVA), polyvinylpyrrolidine (PVP), a polysaccharide such as starch, cellulose and a derivative thereof, polyethylene oxide, polyvinylamine, chitosan, polylysine, polyacrylic acid, polyalginic acid, polyhyaluronic acid, carboxycellulose and the like These have a neutral, anionic or cationic property depending on the ionicity of functional groups Further, as the gelatin, there may be used acid treated gelatin as well as lime treated gelatin A hydrolyzate of gelatin, an enzyme degradation product of gelatin and amino group-modified or carboxyl group-modified gelatin (phthalated gelatin or acetylated gelatin) can also be used The content of the binder contained in the emulsion layer is not particularly limited and can be appropriately determined within the range in which dispersibility and adhesion can be exerted The content of the binder in the emulsion layer is preferably 1/2 or more, and more preferably 1/1 or more, by the volume ratio of Ag/binder <Solvent>

Although the solvent used for the formation of the above-mentioned emulsion layer is not particularly limited, examples thereof include water, organic solvents (for example, an alcohol such as methanol, a ketone such as acetone, an amide such as formamide, a sulfoxide such as dimethyl sulfoxide, an ester such as ethyl acetate, an ether and the like), ionic liquids and mixed solvents thereof The content of the solvent used in the emulsion layer of the invention is within the range of 30 to 90% by mass, and preferably within the range of 50 to 80% by mass, based on the total mass of silver salt, binder and the like contained in the above-mentioned emulsion layer <Antistatic Agent>

The light-sensitive material according to the invention preferably contains an antistatic agent, and it is desirable that a support surface on the opposite side of the emulsion layer is coated therewith As an antistatic layer, there can be used a conductive material-containing layer having a surface resistivity of $10^{12}$ Ω or less under the atmosphere of 25° C. and 25% RH As the antistatic agents preferred in the invention, the following conductive materials can be preferably used There can be used conductive materials described in JP-A-2-18542, from page 2, lower left column, line 13 to page 3, upper right column, line 7, specifically, metal oxides described at page 2, lower right column, lines 2 to 10 and conductive polymer compounds of compounds P-1 to P-7, acicular metal oxides described in U.S. Pat. No. 5,575,957, JP-A-10-142738, paragraph numbers 0045 to 0043 and JP-A-11-223901, paragraph numbers 0013 to 0019, and the like The conductive metal oxide particles used in the invention include $ZnO$, $TiO_2$, $SnO_2$, $Al_2O_3$, $In_2O_3$, $MgO$, $BaO$, $MoO_3$ and composite metal oxides thereof, and particles of metal oxides in which these metal oxides further contain different kinds of atoms As the metal oxides, $SnO_2$, $ZnO$, $Al_2O_3$, $TiO_2$, $In_2O_3$ and $MgO$ are preferred, $SnO_2$, $ZnO$, $In_2O_3$ and $TiO_2$ are more preferred, and $SnO_2$ is particularly preferred Examples of the metal oxides containing different kinds of atoms in small amounts include ZnO doped with Al or In, $TiO_2$ doped with Nb or Ta, $In_2O_3$ doped with Sn, and $SnO_2$ doped with Sb, Nb or a different kind of element such as a halogen atom in an amount of 0 01 to 30 mol % (preferably 0 1 to 10 mol %) When the amount of the different kind of element added is 0 01 mol % or less, it becomes difficult to impart sufficient conductivity to the oxide or the composite oxide Exceeding 30 mol % results in an increase in blackening density of the particles, which unsuitably causes the antistatic layer to become dark Accordingly, in the invention, as the material for the conductive metal oxide particles, preferred is one containing the different kind of element in a small amount based on the metal oxide or the composite metal oxide Further, one containing an oxygen defect in a crystal structure is also preferred As the conductive fine metal oxide particles containing the above-mentioned different kinds of atoms in small amounts, antimony-doped $SnO_2$ particles are preferred, and $SnO_2$ particles doped with 0 2 to 2 0 mol % of antimony are particularly preferred There is no particular limitation on the shape of the conductive metal oxide used in the invention, and it is granular, acicular or the like Further, for the size thereof, the average particle size represented by the sphere-corresponding diameter is from 0 5 to 25 μm Further, in order to obtain conductivity, there can also be used, for example, a soluble salt (for example, a chloride, a nitrate or the like), a deposited metal layer, an ionic polymer as described in U.S. Pat. Nos. 2,861,056 and 3,206,312, or an insoluble inorganic salt as described U.S. Pat. No. 3,428,451

Such a conductive metal oxide particle-containing antistatic layer is preferably provided as an undercoat layer for the back face, an undercoat layer for the emulsion layer, or the like The amount thereof added is preferably from 0 01 to 1 0 g/m² in total in both faces Further, the internal resistivity of the light-sensitive material is preferably from $10 \times 10^7$ to $10 \times 10^{12}$ Ω under the atmosphere of 25° C. and 25% RH In the invention, fluorine-containing surfactants described in JP-A-2-18542, page 4, from upper right column, line 2 to lower right column, line 3 from the bottom and JP-A-3-

39948, from page 12, lower left column, line 6 to page 13, lower right column, line 5 are used in combination with the above-mentioned conductive material, thereby being able to obtain better antistatic properties <Other Additives>

There is no particular limitation on various additives used in the light-sensitive material in the invention, and, for example, the following can be preferably used (1) Nucleation Accelerator The above-mentioned nucleation accelerators include compounds of general formulas (I), (II), (III), (IV), (V) and (IV) described in JP-A-6-82943, compounds of general formulas (II-m) to (II-p) and compound examples II-1 to II-22 described in JP-A-2-103536, from page 9, upper right column, line 13 to page 16, upper left column, line 10, and compounds described in JP-A-1-179939

(2) Spectral Sensitizing Dye

The above-mentioned spectral sensitizing dyes include spectral sensitizing dyes described in JP-A-2-12236, page 8, from lower left column, line 13 to lower right column, line 4, JP-A-2-103536, from page 16, lower right column, line 3 to page 17, lower left column, line 20, JP-A-1-112235, JP-A-2-124560, JP-A-3-7928 and JP-A-5

(3) Surfactant

The above-mentioned surfactants include surfactants described in JP-A-2-12236, page 9, from upper right column, line 7 to lower right column, line 7 and JP-A-2-18542, from page 2, lower left column, line 13 to page 4, lower right column, line 18

(4) Antifoggant

The above-mentioned antifoggants include thiosulfinic acid compounds described in JP-A-2-103536, from page 17, lower right column, line 19 to page 18, upper right column, line 4 and page 18, lower right column, from line 1 to line 5, and further JP-A-1-237538

(5) Polymer Latex

The above-mentioned polymer latexes include ones described in JP-A-2-103536, page 18, lower left column, from line 12 to line 20

(6) Acid Group-Containing Compound

The above-mentioned acid group-containing compounds include compounds described in JP-A-2-103536, from page 18, lower right column, line 6 to page 19, upper left column, line 1

(7) Hardening Agent

The above-mentioned hardening agents include compounds described in JP-A-2-103536, page 18, upper right column, from line 5 to line 17

(8) Black Pepper Inhibitor

The above-mentioned black pepper inhibitor is a compound that inhibits the production of dotted developed silver in an unexposed area, and examples thereof include compounds described in U.S. Pat. No. 4,956,257 and JP-A-1-118832

(9) Redox Compound

The redox compounds include compounds represented by general formula (1) (particularly compound examples 1 to 50) described in JP-A-2-301743, compounds represented by general formulas (R-1), (R-2) and (R-3) and compound examples 1 to 75 described in JP-A-3-174143, from page 3 to page 20, and further, compounds described in JP-A-5-257239 and JP-A-4-27899

(10) Monomethine Compound

The above-mentioned monomethine compounds include compounds represented by general formula (II) (particularly compound examples II-1 to II-26) described in JP-A-2-287532

(11) Dihydroxybenzene

The dihydroxybenzenes include compounds described in JP-A-3-39948, from page 11, upper left column to page 12, lower left column and European Laid-Open Patent EP-452772A <Method for Producing a Conductive Film>

There will be described a method for producing a conductive film using the above-mentioned light-sensitive material The production method of the conductive film of the invention comprises exposing and developing a light-sensitive material having a silver salt emulsion-containing emulsion layer provided on a support to form a metallic silver portion and a light-transmitting portion or a metallic silver portion and an insulating portion, followed by a smoothing treatment (for example, a calender treatment)

The conductive film obtained according to the invention is a film in which the metal is formed on the support by pattern exposure, and the pattern exposure may be either a scanning exposure system or a surface exposure system Further, the metal portion is formed in an exposed area in some cases, and in an unexposed area in the other cases The pattern is a mesh-like pattern when used for the production of the electromagnetic wave-shielding film, and a wiring pattern when used for the production of the printed board Further details of the pattern shape can be appropriately adjusted depending on the purpose The production method of the conductive film of the invention includes the following three modes depending on the light-sensitive material and development (1) A mode in which a photosensitive silver salt black-and-white light-sensitive material containing no physical development nuclei is subjected to chemical development or thermal development to form the metallic silver portion on the light-sensitive material, (2) A mode in which a photosensitive silver salt black-and-white light-sensitive material containing physical development nuclei in the silver halide emulsion layer is subjected to dissolution physical development to form the metallic silver portion on the light-sensitive material, and (3) A mode in which a photosensitive silver salt black-and-white light-sensitive material containing no physical development nuclei and an image receiving sheet having a non-photosensitive layer containing physical development nuclei are laminated with each other, and subjected to diffusion transfer development to form the metallic silver portion on the non-photosensitive image receiving sheet The mode of the above (1) is an integral black-and-white development type, and the light-transmitting conductive film such as the light-transmitting electromagnetic wave-shielding film or the conductive film having printed wiring is formed on the light-sensitive material Developed silver obtained is chemically developed silver or thermally developed silver, and has high activity in a subsequent plating or physical development process in that it is in filament form having a high specific surface area In the mode of the above (2), in the exposed area, the silver halide grains in the vicinities of the physical development nuclei are dissolved and deposited on the development nuclei, thereby forming on the support the light-transmitting conductive film such as the light-transmitting electromagnetic wave-shielding film or the light-transmitting conductive film, or the conductive film having printed wiring This is also an integral black-and-white development type The development action is deposition on the physical development nuclei, so that activity is high However, developed silver is in spherical form having a low specific surface area In the mode of the above (3), in the unexposed area, the silver halide grains are dissolved, diffused and deposited on the development nuclei on the image receiving sheet, thereby forming on the image receiving sheet the light-transmitting conductive film such as the light-transmitting electromagnetic wave-shielding film or the light-transmitting conductive film, or the conductive film having printed wiring This is a so-called separate type, and a mode in which the image receiving sheet is separated from the light-sensitive material to use In all the modes, either negative development or reversal development can also be selected In the case of the diffusion transfer system, it is also possible to employ a mode in which negative type development is performed by using an autopositive type light-sensitive material as the light-sensitive material Chemical development, thermal development, dissolution physical development and diffusion transfer development as used herein have the same meanings as the terms ordinarily used in the industry, and are explained in general textbooks of photographic chemistry, for example, Shinichi Kikuchi, *Photographic Chemistry* (published by Kyoritsu Shuppan Co, Ltd) and The Theory of Photographic Process, 4th ed edited by C E K Mees

[Exposure]

In the production method of the invention, the silver salt-containing layer provided on the support is exposed The exposure can be performed by using electromagnetic waves Examples of the electromagnetic waves include light such as visible light and ultraviolet rays, radiations such as X-rays, and the like Further, for the exposure, a light source having wavelength distribution or a light source having a specific wavelength may be used The shape of patterning of irradiated light is a mesh-like pattern for the production of the electromagnetic wave-shielding film, and a wiring pattern for the production of the printed board The above-mentioned exposure includes, for example, scanning exposure using a cathode ray tube (CRT) The cathode ray tube exposure apparatus is convenient and compact, and requires low cost, compared to an apparatuses using a laser Further, adjustment of optical axes and colors is also easy In the cathode ray tube used for image exposure, various illuminants that emit light in a certain spectrum region are used as needed As the illuminant, there is used, for example, any one of a red illuminant, a green illuminant and a blue illuminant, or a mixture of two or more thereof The spectrum region is not limited to the above-mentioned red, green and blue regions, and a fluorescent substance that emit light in a yellow, orange, purple or infrared region is also be used In particular, a cathode ray tube in which these illuminants are mixed to emit white light is often used Further, an ultraviolet lamp is also preferred, and the g-line of a mercury lamp, the i-line of a mercury lamp and the like can also be utilized Further, in the production method of the invention, the exposure can be performed by using various laser beams For example, in the exposure in the invention, there can be preferably used a scanning exposure system using monochromatic high density light such as light emitted by a gas laser, a light emitting diode, a semiconductor laser or a second harmonic generation (SHG) light source using a semiconductor laser or a solid-state laser using a semiconductor laser as an excitation light source and nonlinear optical crystals in combination Further, a KrF excimer laser, an ArF excimer laser, an F2 laser and the like can also be used In order to make the system compact and inexpensive, the exposure is preferably performed by using a semiconductor laser or a second harmonic generation (SHG) light source using a semiconductor laser or a solid-state laser and nonlinear optical crystals in combination In particular, in order to design a compact, inexpensive, long-life and highly stable apparatus, the exposure is preferably performed by using a semiconductor laser As laser light sources, there are preferably used, specifically, a blue semiconductor laser having a wavelength of 430 to 460 nm (announced by Nichia Corporation at the 48th Lecture Meeting of Applied Physics-Related Union, March 2001), a green laser having a wavelength of about 530 nm taken out by converting the wavelength of a semiconductor laser (oscillation wavelength about 1060 nm) using $LiNbO_3$ SHG crystals having a waveguide-like reversed domain structure, a red semiconductor laser having a wavelength of about 685 nm (Hitachi, Type No HL6738MG), a red semiconductor laser having a wavelength of about 650 nm (Hitachi, Type No HL6501MG) and the like A method for exposing the silver salt-containing layer in pattern form may be performed by surface exposure utilizing a photomask or scanning exposure with a laser beam In this case, the exposure may be refraction type exposure using a lens or reflection type exposure using a reflecting mirror, and there can be used exposure systems such as contact exposure, proximity exposure, reduction projection exposure and reflecting projection exposure

[Development]

In the production method of the invention, the silver salt-containing layer is further developed after the exposure The development can be performed by using usual development techniques used for silver salt photographic films, photographic paper, films for printing plate making, emulsion masks for photomasks and the like Although the developing solution is not particularly limited, there can also be used a PQ developing solution, an MQ developing solution, an MAA developing solution and the like As commercial products, there can be used, for example, developing solutions such as CN-16, CR-56, CP45X, FD-3 and Papitol manufactured by Fuji Photo Film Co, Ltd and C-41, E-6, RA-4, Dsd-19 and D-72 manufactured by KODAK, or developing solutions contained in kits thereof As lith developing solutions, there can be used D85 manufactured by KODAK, and the like In the production method of the invention, the above-mentioned exposure and development are performed, whereby the patterned metallic silver portion is formed in the exposed area, and the light-transmitting portion described later is formed in the unexposed area After the developing treatment, continuously, the sample is rinsed in water if necessary for a treatment for removing the binder, to obtain a preferable film with high conductivity The development in the production method of the invention can include fixing performed for removing a silver salt from an unexposed area for stabilization The fixing in the production method of the invention can be performed by using fixing techniques used for silver salt photographic films, photographic paper, films for printing plate making, emulsion masks for photomasks and the like The developing solution used in the development can contain an image quality improver for the purpose of improving image quality The above-mentioned image quality improvers include, for example, nitrogen-containing heterocyclic compounds such as benzotriazole Further, when the lith developing solution is used, it is also preferred that particularly, polyethylene glycol is used The mass of metallic silver contained in the exposed area after the development is preferably 50% by mass or more, and more preferably 80% by mass or more, based on the mass of silver contained in the exposed area before the exposure When the mass of silver contained in the exposed area is 50% by mass or more based on the mass of silver contained in the exposed area before the exposure, high conductivity is easily obtained, so that such content is preferred The metallic silver portion contained in the exposed portion after the developing treatment comprises silver and a non-conductive polymer, wherein the volume ratio of Ag/the non-conductive polymer is preferably 2/1 or more, more preferably 3/1 or more Although the gradation after the development in the invention is not particularly limited, it is preferred to exceed 4 0 When the gradation after the development exceeds 4 0, conductivity of the conductive metal portion can be increased while maintaining high transparency of the light-transmitting portion Means for increasing the gradation to 4 0 or more include, for example, the above-mentioned doping with rhodium ions or iridium ions

[Oxidization Treatment]

In the production method of the invention, the metallic silver portion after the development is preferably subjected to an oxidization treatment For example, when the metal is slightly deposited on the light-transmitting portion, this metal can be removed by performing the oxidization treatment to attain a transparency of the light-transmitting portion of approximately 100%

The above-mentioned oxidization treatment includes, for example, known methods using various oxidizing agents such as Fe(III) ion treatment The oxidization treatment can be performed either after the exposure and development of the silver salt-containing layer In the invention, the metallic silver portion after the exposure and development can be further treated with a solution containing Pd Pd may be either a bivalent palladium ion or metallic palladium This treatment can inhibit the black color of the metallic silver portion from changing with time In the production method of the invention, the mesh-like metallic silver portion is formed by subjecting the aforementioned metal silver portion in which the line width, the open area ratio and the Ag content are specified is directly formed on the support by the exposure and development, so that it has a sufficient surface resistance value It is therefore unnecessary to further perform the physical development and/or plating to the metallic silver portion, thereby imparting conductivity thereto again Accordingly, the light-transmitting electromagnetic wave-shielding film can be produced by a simple process As described above, the light-transmitting electromagnetic wave shield of the invention can be suitably used as the light-transmitting electromagnetic wave-shielding film for a plasma display panel Accordingly, a plasma display panel formed by using the light-transmitting electromagnetic wave-shielding film for a plasma display panel comprising the light-transmitting electromagnetic wave-shielding film of the invention has high electromagnetic wave-shielding ability, high contrast and high lightness, and can be produced at low cost

[Reduction Treatment]

By dipping in an aqueous reducing solution after the developing treatment, a preferable film with high conductivity can be obtained As the aqueous reducing solution, there may be used aqueous sodium sulfite solution, aqueous hydroquinone solution, aqueous p-phenylenediamine solution, and aqueous oxalic acid solution, wherein the aqueous solutions are more preferably adjusted to pH 10 or more

[Smoothing Treatment]

The invention is characterized in that the smoothing treatment is performed to the developed metal portion (the mesh-like metal pattern portion or the wiring metal pattern), thereby significantly increasing conductivity of the metal portion, and obtaining the light-transmitting electromagnetic wave-shielding film simultaneously having high electromagnetic wave-shielding properties and high translucency, and having the black mesh portion and the printed board simultaneously having high conductivity and high insulating properties, and having no pinholes The smoothing treatment can be performed, for example, with a calender roll unit The calender roll unit usually comprises a pair of rolls As the rolls used for calendering, there are used plastic rolls such as epoxy, polyimide, polyamide and polyimideamide rolls and metal rolls In particular, in the case of both-side emulsion coating, it is preferred to perform the treatment with the pair of metal rolls The line pressure is preferably 980 N/cm (100 kgf/cm) or more, more preferably 1960 N/cm (200 kgf/cm) or more, and further more preferably 2940 N/cm (300 kgf/cm) or more The temperature applied to the smoothing treatment represented by the calender roll treatment is preferably from 10 (no temperature control) to 100° C., and more preferably ranges from about 10 (no temperature control) to 50° C., although it varies depending on the density of scanning or shape of the mesh-like metal pattern or the wiring metal pattern, and the binder species As described above, according to the production method of the invention, the conductive film having high conductivity such as a surface resistance value of 2 5 Ω/sq or less can be simply produced at low cost

EXAMPLES

The invention will be illustrated in greater detail with reference to the following examples The materials, amounts used, proportions, treatment contents, treatment procedures and the like described in the following examples can be appropriately changed without departing from the spirit and scope of the invention Accordingly, the scope of the invention should not be construed as being restrictively interpreted by the examples shown below Examples 1 to 4 and Comparative Examples 1 to 3

| (Preparation of Emulsion A) | |
|---|---|
| Solution 1 | |
| Water | 750 ml |
| Gelatin (Phthalated Gelatin) | 20 g |
| Sodium Chloride | 3 g |
| 1,3-Dimethylimidazolidine-2-thione | 20 mg |
| Sodium Benzenethiosulfonate | 10 mg |
| Citric Acid | 0.7 g |
| Solution 2 | |
| Water | 300 ml |
| Silver Nitrate | 150 g |
| Solution 3 | |
| Water | 300 ml |
| Sodium Chloride | 38 g |
| Potassium Bromide | 32 g |
| Potassium Hexachloroiridate (III) (0.005% KCl, 20% aqueous solution) | 5 ml |
| Ammonium Hexachlororhodate (0.001% NaCl, 20% aqueous solution) | 7 ml |

Potassium hexachloroiridate (III) (0 005% KCl, 20% aqueous solution) and ammonium hexachlororhodate (0 001% NaCl, 20% aqueous solution) used in solution 3 were each prepared by dissolving respective powders in a 20% solution of KCl and a 20% solution of NaCl, respectively, followed by heating at 40° C. for 120 minutes To solution 1 kept at 38° C. and pH 4 5, solution 2 and solution 3 were each simultaneously added in an amount corresponding to 90% thereof with stirring over a period of 20 minutes to form 0 16-μm nuclear grains Subsequently, solution 4 and solution 5 described below were added over a period of 8 minutes, and the remaining 10 percents of solution 2 and solution 3 were added over 2 minutes to allow the particles to grow to 0 21 μm Further, 0 15 g of potassium iodide was added, followed by ripening for 5 minutes, thus terminating the formation of grains

|  | Solution 4 |  |
|---|---|---|
| Water |  | 100 ml |
| Silver Nitrate |  | 50 g |
|  | Solution 5 |  |
| Water |  | 100 ml |
| Sodium Chloride |  | 13 g |
| Potassium Bromide |  | 11 g |
| Yellow Prussiate of Potash |  | 5 mg |

Then, washing was normally performed by a flocculation method Specifically, the temperature was lowered to 35° C., and the pH was decreased with sulfuric acid until the silver halide was sedimented The pH range was 3 6±0 2 Then, about 3 liters of a supernatant was removed (the first washing) Further, 3 liters of distilled water was added, and then, sulfuric acid was added until the silver halide was sedimented Then, 3 liters of the supernatant was removed again (the second washing) The same operation as the first washing was repeated once more (the third washing), thus terminating washing and desalting processes The emulsion after washing and desalting was adjusted to pH 6 4 and pAg 7 5, and 10 mg of sodium benzenethiosulfonate, 3 mg of sodium benzenethiosulfinate, 15 mg of sodium thiosulfate and 10 mg of chloroauric acid were added Then, chemical sensitization was performed at 55° C. so as to obtain the optimum sensitivity, and 100 mg of 1,3,3a,7-tetraazaindene as a stabilizer and 100 mg of Proxel (trade name, manufactured by ICI Co, Ltd) as a preservative were added Finally, a cubic silver iodochlorobromide grain emulsion containing 70 mol % of silver chloride and 0 08 mol % of silver iodide and having an average grain size of 0 22 μm and a coefficient of variation of 9% was obtained (finally, resulting in pH=6 4, pAg=7 5, electric conductance=40 μS/m, density=1 2×10³ kg/m³ and viscosity=60 mPa s, as the emulsion)

(Preparation of Emulsion B)

An emulsion prepared under the same conditions as for the preparation of emulsion A, except for the adjustment of the amount of gelatin in the first solution to 8 g, was defined as emulsion B (Preparation of Coated Sample)

To the above-mentioned emulsions A and B, 5 7×10⁻⁴ mol/mol Ag of sensitizing dye (sd-1) was added to perform spectral sensitization Further, 3 4×10⁻⁴ mol/mol Ag of KBr and 8 0×10⁻⁴ mol/mol Ag of compound (Cpd-3) were added, followed by followed by thorough stirring Then, 1 2×10⁻⁴ mol/mol Ag of 1,3,3a,7-tetraazaindene, 1 2×10⁻² mol/mol Ag of hydroquinone, 3 0×10⁻⁴ mol/mol Ag of citric acid, 90 mg/m² of 2,4-dichloro-6-hydroxy-1,3,5-triazine sodium salt, 15% by mass (based on gelatin) of colloidal silica having a particle size of 10 μm, 50 mg/m² of aqueous latex (aqL-6), 100 mg/m² of a polyethyl acrylate latex, 100 mg/m² of a latex copolymer of methyl acrylate, sodium 2-acrylamide-2-methylpropanesulfonate and 2-acetoxyethyl methacrylate (mass ratio 88 5 7), 100 mg/m² of a core-shell type latex (core styrene/butadiene copolymer (mass ratio 37/63), shell styrene/2-acetoxyethyl acrylate (mass ratio 84/16), core/shell ratio=50/50) and 4% by mass (based on gelatin) of compound (Cpd-7) were added, and the pH of the coating solution was adjusted to 5 6 using citric acid The coating solution using emulsion A for an emulsion layer thus prepared are applied onto a polyethylene terephthalate (PET) film so as to give 10 5 g/m² of Ag and 0 94 g/m² of gelatin, and then dried and defined as coated sample A As the PET film, there was used one previously subjected to a hydrophilizing treatment A coating solution of an emulsion layer using emulsion B as prepared in the manner described above was coated on polyethylene terephthalate (PET) to Ag of 10 5 g/m² and gelatin of 0 33 g/m², which was then dried and defined as coated sample B

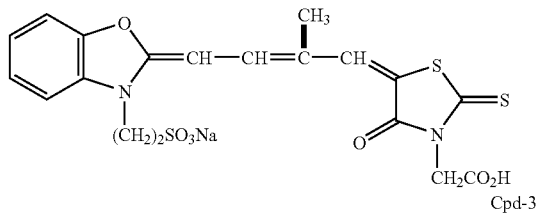

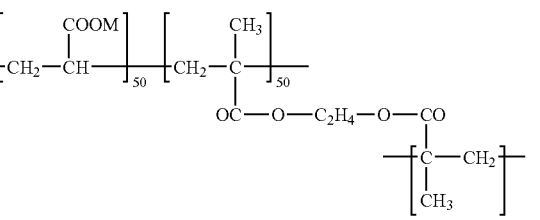

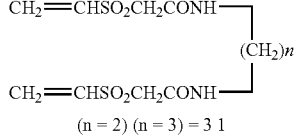

In the resulting coated sample A, the Ag/binder volume ratio of the emulsion layer is 1/0 7, and this corresponds to an Ag/binder ratio of 1/1 or more that is preferably used in the light sensitive material for conductive film formation of the invention In the coated sample B, the volume ratio of Ag/the binder in the emulsion layer is 4/1, satisfying the condition that the Ag/a binder ratio should be 2/1 or more for more preferable use in the light-sensitive invention (Exposure and Development)

The dried coated film was exposed through a grid-like photomask that can provide a developed silver image of line/space=5 µm/195 µm (a photomask of line/space 195 µm/5 µm (pitch 200 µm) in which spaces are in grid form) by using parallel light whose light source is a high-pressure mercury lamp, developed with the following developing solution, further developed by using a fixing solution (trade name N3X-R for CN16X, manufactured by Fuji Photo Film Co, Ltd) and then rinsed with pure water Thus, samples A and B different in line width and open area ratio were obtained Samples a and b were obtained A-a and A-b were prepared for the coated sample A, while B-a and B-b were prepared for the coated sample B The following compounds are contained in 1 liter of the developing solution

| | |
|---|---|
| Hydroquinone | 0.037 mol/L |
| N-Methylaminophenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

(Calender Treatment)

The sample developed as described above was subjected to a calender treatment Calender rolls were composed of metal rolls The sample was passed between the rolls applying a line pressure of 4900 N/cm (500 kg/cm) thereto, and the surface resistance values before and after the treatment were measured The sample A-a before the calendar treatment is A-a-1 (Comparative Example 1) and A-a after the calendar treatment is A-a-2 (Example 1), A-b before the calendar treatment is A-b-1 (Comparative Example 2) and A-b after the calendar treatment is A-b-2 (Example 2)

The sample B before the calendar treatment is B-a-1 (Comparative Example 3) and the sample B after the calendar treatment is B-a-2 (Example 3)

The resulting sample B-a-2 where the volume ratio of Ag/the non-conductive polymer at the metallic silver portion is 3 1/1 and which is at a density of 8 5 g/cm$^3$ and a thickness of 1 2 µm, is preferably used for the conductive film of the invention, because the sample satisfies the conditions that the volume ratio of Ag/the non-conductive polymer at the metallic silver portion should be 3/1 or more and the thickness should be 0 5 µm to 5 µm (Blackening Treatment)

The transparent film with a mesh-like silver image formed thereon was electrically plated in a bath of a blackening plating solution of the following composition, using carbon as an anion electrode The plating solution for the blackening plating treatment is as follows Composition of Blackening Solution

| | |
|---|---|
| Nickel sulfate•6 hydrate salt | 120 g |
| Ammonium thiocyanate | 17 g |
| Zinc sulfate•7 hydrate salt | 28 g |
| Sodium sulfate | 16 g |

-continued

| | |
|---|---|
| Addition of Water | (in total of one liter) |
| pH 5.0 (pH adjusted with sulfuric acid and sodium hydroxide) | |
| Plating conditions | |
| Bath temperature | about 30° C. |
| Time period | 20 seconds |
| Cation electrode current density (0.03 A current for the whole cation electrode (35 mm × 12 cm)) | 0.1 to 0.2 A/dm2 |

An blackening-treated sample from the sample B-a-2 (Example 3) is defined as B-a-3 (Example 4)

Comparative Examples 4 to 7

(Preparation of Samples for Comparison)

For the comparison with a technique that is highest in conductivity and high in light transmitting properties, of those known at present, a metal mesh described in JP-A-10-41682 was prepared as a representative of the "etching-processed copper mesh utilizing photolithography" described in the section of "Background Art" described above, and taken as Comparative Example 4

This sample was prepared in the same manner as in the example of JP-A-10-41682

In order to allow the mesh shape (line width and pitch) to agree with that of the sample of the invention, the same 200-µm pitch photomask as described above was utilized Further, a metal mesh described in JP-B-42-23746 was prepared as a representative of a silver salt diffusion transfer process of depositing silver on physical development nuclei, which is the "conductive silver forming method utilizing silver salt" described in the section of "Background Art" described above, and taken as Comparative Example 5 This sample was prepared by coating a hydrophilized transparent TAG (triacetyl cellulose) support with a physical development nucleus layer and a photosensitive layer, giving exposure through a mesh-like photomask having a pitch of 200 µm and performing development by a DTR method, in the same manner as described in Example 3 of JP-B-42-23746

Furthermore, a metal mesh described in JP-A-2000-13088 was prepared as a representative of the "silver paste-printed mesh" described in the section of Background Art described above For this metal mesh, samples of Comparative Examples 6 and 7 different in open area ratio were prepared (Evaluation)

For the samples of the invention each having the conductive metal portion and the light-transmitting portion and the samples for comparison thus obtained, the line width of the conductive metal portion was measured to determine the open area ratio, and further, the surface resistance value was measured In each measurement, an optical microscope, a scanning electron microscope and a low resistivity meter were used Further, the color of the metal portion of the mesh was visually observed Black was taken as "good", and brown to gray was taken as "poor" Furthermore, as for the number of processes in the production method, one having 5 or less processes was evaluated as "good", and one having 6 or more processes was evaluated as "poor"

The film strength was evaluated as follows

Scratching the face with the mesh metal part formed thereon using a 0 1-mm-ϕ sapphire needle at a speed of 1 cm/second By changing the load on the sapphire needle from 0 to 100 g, the load at which scratches reach the base is used as the marker of the film strength In Table 1, "Good" indicates the load at which scratches occur is 80 g or more, "Fair" indicates the load at which scratches occur is 50 g, and "Poor" indicates the load at which scratches occur is 20 g The results of evaluation as well as the data of the samples for comparison are shown in Table 1

TABLE 1

| | Sample | Line Width (μm) | Open Area Ratio (%) | Surface Resistance (Ω/sq) | Process | Color | Film Strength | Remark |
|---|---|---|---|---|---|---|---|---|
| Comparative Example 1 | Sample A-a-1 (Not calendered) | 15 | 86 | 2.5 | Good | Good | Poor | Comparison |
| Example 1 | Sample A-a-2 (Calendered) | 15 | 86 | 1.0 | Good | Good | Good | Invention |
| Comparative Example 2 | Sample A-b-1 (Not calendered) | 9 | 91 | 3.5 | Good | Good | Poor | Comparison |
| Example 2 | Sample A-b-2 (Calendered) | 9 | 91 | 1.5 | Good | Good | Good | Invention |
| Comparative Example 3 | Sample B-a-1 (Not calendered) | 15 | 86 | 2.0 | Good | Good | Poor | Comparison |
| Example 3 | Sample B-a-2 (Calendered) | 15 | 86 | 0.5 | Good | Good | Fair | Invention |
| Example 4 | Sample B-a-3 (Blackening treatment) | 15 | 86 | 0.5 | Good | Good | Good | Invention |
| Comparative Example 4 | JP-A-10-41682 Supplementary examination | 12 | 88 | 0.1 | Poor | Poor | Good | Comparison Etching |
| Comparative Example 5 | JP-B-42-23746 Supplementary examination | 15 | 86 | 90 | Good | Poor | Fair | Comparison Silver salt |
| Comparative Example 6 | JP-A-2000-13088 Supplementary | 20 | 81 Pitch 200 μm | 5 | Good | Good | Fair | Comparison Silver paste |
| Comparative Example 7 | examination | 20 | 87 Pitch 200 μm | 9 | Good | Good | Fair | |

As seen from Table 1, the etching-processed copper mesh of Comparative Example 4 was brown in mesh color, and the number of processes was also many Further, for the mesh utilizing the silver salt of Comparative Example 5, the surface resistance value was high, and the electromagnetic wave-shielding ability was insufficient Furthermore, for the silver paste-printed mesh of Comparative Example 6, the open area ratio was low because of its thick line width In addition, for such a mesh, it is possible to increase the open area ratio by widening the pitch as the silver paste-printed mesh of Comparative Example 7 However, in that case, the surface resistance value increased In contrast, the samples of the invention (Examples 1 and 2) do not have problems observed in the above-mentioned Comparative Examples The line width is thin, the open area ratio is high, and the surface resistance value is low (the electromagnetic wave-shielding ability is high) Further, the metal portion of the mesh of the inventive sample (Example 4) is black, so that an adverse effect (a reduction in contrast) to images of a display can be avoided Furthermore, the number of processes in the production was small It is further demonstrated that the inventive sample has high film strength involving less break or peel during handling so the inventive sample has high quality reliability

INDUSTRIAL APPLICABILITY

According to the invention, there can be provided a light-transmitting electromagnetic wave-shielding film having high conductivity, electromagnetic wave-shielding properties and high translucency, and having a black mesh portion Further, according to the invention, there can be provided a method for producing a light-transmitting electromagnetic wave-shielding film having high electromagnetic wave-shielding properties and high transparency, and having a black mesh portion, in which the formation of a fine line pattern is possible in a short process, and which can be produced at low cost in large amounts Furthermore, according to the invention, there can be provided a printed board having high conductivity and few pinholes Moreover, according to the invention, there can be provided a method for producing a printed board, with possible formation of a fine line pattern and small environmental loading at low cost in large amounts The entire disclosure of each and every foreign patent application from which the benefit of foreign priority has been claimed in the present application is incorporated herein by reference, as if fully set forth

The invention claimed is:

1. A method for producing a conductive film, which comprises:
   exposing and developing a light-sensitive material comprising a support and thereon an emulsion layer containing a carboxyl group modified gelatin and a silver salt emulsion to form a metallic silver portion; and then
   subjecting the light-sensitive material to a smoothing treatment.

2. The method according to claim 1, which comprises:
   exposing and developing a light-sensitive material comprising a support and thereon an emulsion layer containing a silver salt emulsion to form a metallic silver portion and a light-transmitting portion; and then
   subjecting the light-sensitive material to a smoothing treatment.

3. The method according to claim 1, which comprises:
exposing and developing a light-sensitive material comprising a support and thereon an emulsion layer containing a silver salt emulsion to form a metallic silver portion and an insulating portion; and then
subjecting the light-sensitive material to a smoothing treatment.

4. The method according to claim 1,
wherein the metallic silver portion after the smoothing treatment comprises a silver and a non-conductive polymer, and
wherein a volume ratio of Ag/the non-conductive polymer is 2/1 or more.

5. The method according to claim 4,
wherein 50% or more of a volume of the non-conductive polymer is occupied by gelatin.

6. The method according to claim 1,
wherein the metallic silver portion after the smoothing treatment comprises a silver and a non-conductive polymer, and
wherein a volume ratio of Ag/the non-conductive polymer is 3/1 or more.

7. The method according to claim 1, which further comprises:
dipping the light-sensitive material in an aqueous solution of a reducing agent between after the developing treatment and to the smoothing treatment.

8. The method according to claim 1, which further comprises:
subjecting a surface of the metallic silver portion to a blackening treatment after the smoothing treatment.

9. The method according to claim 8,
wherein a solution for the blackening treatment contains at least one of nickel, zinc and tin.

10. The method according to claim 1,
wherein the smoothing treatment is performed with a calender roll unit.

11. The method according to claim 10,
wherein the smoothing treatment with the calender roll unit is performed at a line pressure of 980 N/cm (100 kgf/cm) or more.

12. The method according to claim 10,
wherein the smoothing treatment with the calender roll unit is performed at a line pressure of 1960 N/cm (200 kgf/cm) or more.

13. The method according to claim 10,
wherein the smoothing treatment with the calender roll unit is performed at a line pressure of 2940 N/cm (300 kgf/cm) or more.

14. The method according to claim 1,
wherein a volume ratio of Ag/a binder in the emulsion layer is 1/2 or more.

15. The method according to claim 1,
wherein a volume ratio of Ag/a binder in the emulsion layer is 1/1 or more.

16. The method according to claim 1,
wherein a volume ratio of Ag/a binder in the emulsion layer is 2/1 or more.

17. The method according to claim 1,
wherein the emulsion layer is provided on both sides of the support.

18. The method according to claim 1,
wherein the support has flexibility.

19. The method according to claim 1,
wherein the support is a polyethylene terephthalate (PET) film.

20. The method according to claim 1,
wherein the support is a polyimide film.

21. The method according to claim 1,
wherein the conductive film has electromagnetic wave-shielding properties.

22. A conductive film obtained by a production method according to claim 1.

23. The conductive film according to claim 22, which comprises
a support and thereon
a metal wiring pattern containing a silver at a density of 8.0 g/cm$^3$ to 10.5 g/cm$^3$.

24. The conductive film according to claim 23,
wherein a thickness of the metal wiring pattern is from 0.5 μm to 5 μm.

25. The conductive film according to claim 22, which is an electromagnetic wave-shielding film.

26. The conductive film according to claim 22, which is a printed wiring board.

27. The method according to claim 1, wherein carboxyl group-modified gelatin is selected from the group consisting of phthalated gelatin and acetylated gelation.

* * * * *